(12) United States Patent
Wang

(10) Patent No.: US 9,149,753 B2
(45) Date of Patent: Oct. 6, 2015

(54) FILTER MEMBER

(71) Applicant: Hewlett-Packard Development Company, L.P., Houston, TX (US)

(72) Inventor: Hsiu Hsien Wang, Taipei (TW)

(73) Assignee: Hewlett-Packard Development Company, L.P., Houston, TX (US)

( * ) Notice: Subject to any disclaimer, the term of this patent is extended or adjusted under 35 U.S.C. 154(b) by 81 days.

(21) Appl. No.: 13/850,801

(22) Filed: Mar. 26, 2013

(65) Prior Publication Data

US 2014/0290193 A1 Oct. 2, 2014

(51) Int. Cl.
*B01D 46/00* (2006.01)
*G06F 1/20* (2006.01)
*G06F 1/18* (2006.01)
*H05K 7/20* (2006.01)

(52) U.S. Cl.
CPC ........ *B01D 46/0087* (2013.01); *B01D 46/0086* (2013.01); *G06F 1/181* (2013.01); *G06F 1/20* (2013.01); *H05K 7/20181* (2013.01)

(58) Field of Classification Search
USPC ................. 55/385.1, 385.2, 385.6, 471, 473, 55/DIG. 18, DIG. 29, DIG. 46; 454/187, 454/188, 189, 191, 184, 49, 56, 57, 229, 454/238; 156/345.32, 643, 657; 118/719, 118/731, 733; 414/217, 222.03, 416.08, 414/225
See application file for complete search history.

(56) References Cited

U.S. PATENT DOCUMENTS

| | | | | |
|---|---|---|---|---|
| 2,157,307 A | * | 5/1939 | Savage | 96/379 |
| 4,765,230 A | * | 8/1988 | Soethout et al. | 454/139 |
| H0000895 H | * | 3/1991 | Weber | 95/284 |
| 5,127,927 A | * | 7/1992 | Holmes et al. | 55/313 |
| 6,230,328 B1 | * | 5/2001 | Holloway | 2/8.3 |
| 6,746,502 B2 | | 6/2004 | Yair et al. | |
| 7,918,910 B2 | * | 4/2011 | Ahn et al. | 55/385.1 |
| 8,371,704 B1 | * | 2/2013 | Lin | 359/613 |
| 2006/0026936 A1 | * | 2/2006 | Paumier et al. | 55/473 |
| 2008/0073295 A1 | * | 3/2008 | Moll et al. | 210/767 |
| 2009/0150133 A1 | | 6/2009 | Archibald et al. | |
| 2009/0261208 A1 | * | 10/2009 | Belyew | 244/53 B |
| 2011/0297351 A1 | | 12/2011 | Vosper et al. | |
| 2012/0200561 A1 | * | 8/2012 | Bando | 345/419 |

FOREIGN PATENT DOCUMENTS

| | | |
|---|---|---|
| CN | 2230344 | 7/1996 |
| JP | 3201500 | 9/1991 |

OTHER PUBLICATIONS

Zhou, D. et al.; Design and Development of Thermal-mechanical Solutions for a Community Personal Computer; http://ieeexplore.ieee.org/stamp/stamp.jsp?arnumber=1707565 > On Page(s): 55-62; Jun. 27-28, 2006.

* cited by examiner

*Primary Examiner* — Duane Smith
*Assistant Examiner* — Minh-Chau Pham
(74) *Attorney, Agent, or Firm* — Hewlett-Packard Patent Department

(57) ABSTRACT

A filter member is movable between a first position and a second position when passage of air through the filter member is obstructed.

20 Claims, 11 Drawing Sheets

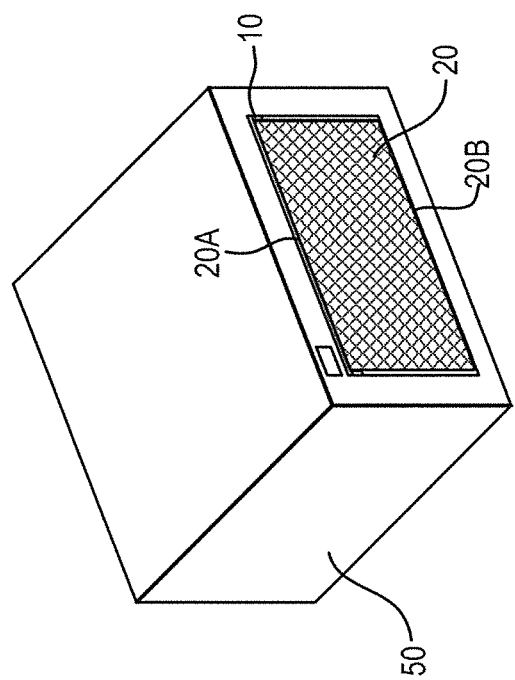
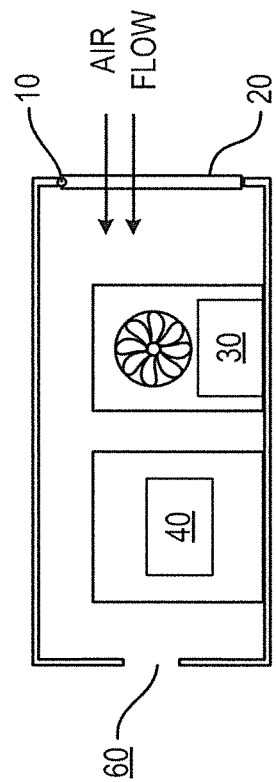
Fig.1A
Fig.1B

FILTER MEMBER

BACKGROUND

Computing equipment may be kept in housing such as a server rack. The housing typically includes a fan for ventilation and an air filter to prevent excessive dust or dirt from being drawn into the housing.

BRIEF DESCRIPTION OF THE DRAWINGS

Examples will now be described, by way of non-limiting example only, with reference to the accompanying drawings, in which:

FIG. 1A is a perspective view showing an example of an apparatus including a filter member according to the present disclosure;

FIG. 1B is a schematic diagram showing an example of the apparatus of FIG. 1A;

DETAILED DESCRIPTION

Figure 2B:
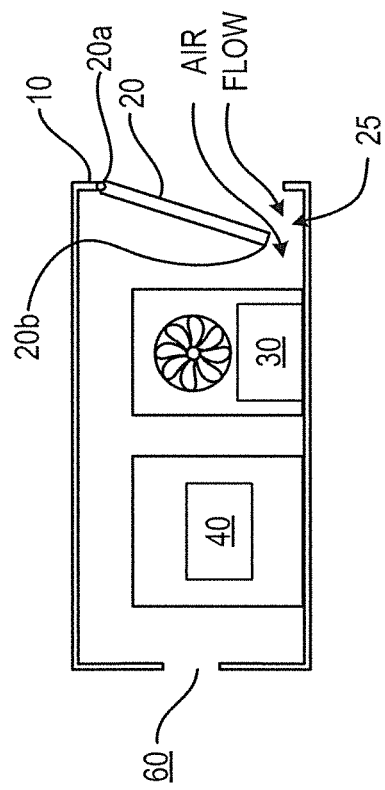
FIG. 2B is a schematic diagram showing an example of the apparatus of FIG. 2A.

Computing equipment, such as servers, data storage devices, switches or routers etc may be located in a housing, such as a server rack. The housing typically comprises a chassis to support the computing equipment and may have a fan for ventilation. Typically the fan draws air into the housing through an air filter which filters out at least some of the dirt and dust in the surrounding environment in order to protect the computing equipment.

According to one example of the present disclosure a filter member is movable between a position in which air passes through the filter member and a position in which air can flow through a gap between the filter member and the housing. This allows air to flow into the housing even when passage of air through the filter member is obstructed. This may help to prevent overheating and/or reduce stress on the fan.

FIG. 1A is a perspective view of an apparatus for housing computing equipment. In the example of FIG. 1A, the apparatus comprises a frame 10 and a filter member 20. The filter member 20 may comprise any suitable air filter for removing dust and dirt. For example, it may comprise a woven or non-woven mesh, nylon, polypropylene filter element etc. In the context of this disclosure the term 'frame' 10 simply means a part of the apparatus which is adjacent the filter member. It does not have to completely surround the filter member. The frame may be one piece or it may comprise several different parts.

FIG. 1B is a schematic diagram showing the apparatus of FIG. 1A and an example of its contents. In this example the apparatus houses a fan 30 for drawing air into the apparatus to provide ventilation and computing equipment 40 (such as a server, storage or network device). The positioning of the fan and the computing equipment shown in FIG. 1B is just an example and may be varied; furthermore the apparatus may be sold without the computing equipment and a user may install the computing equipment later. In the example of FIG. 1B the apparatus has a main body comprising walls 50 to protect the computing equipment from the external environment and one or more outlets 60 through which air blown by the fan can leave the apparatus.

In the example of FIGS. 1A and 1B the filter member 20 adopts a first position (hereinafter referred to as a 'closed' position) in which the filter member 20 is positioned against the frame. In this closed position air drawn in by the fan generally enters the apparatus by passing through the frame and filter member 20 as shown by the arrows in FIG. 1B.

Figure 2A:
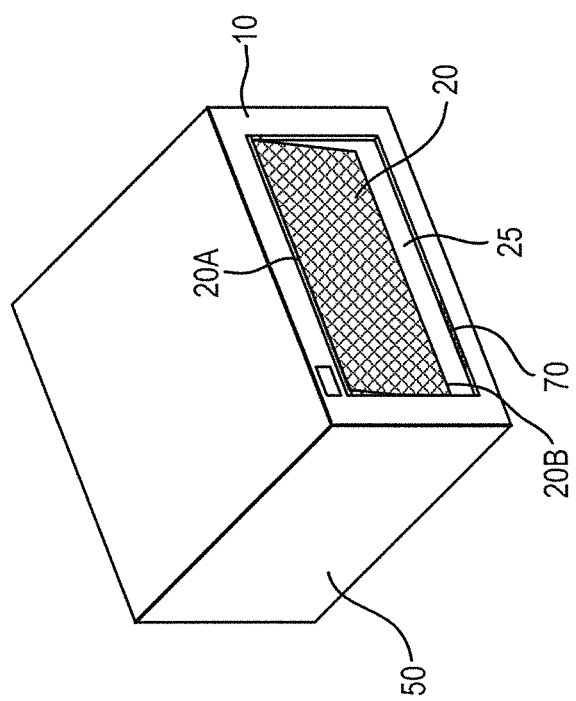
FIG. 2A is a perspective view showing an example of the apparatus of FIG. 1A in which the filter member is in a different position compared to FIG. 1A.
Figure 2C:
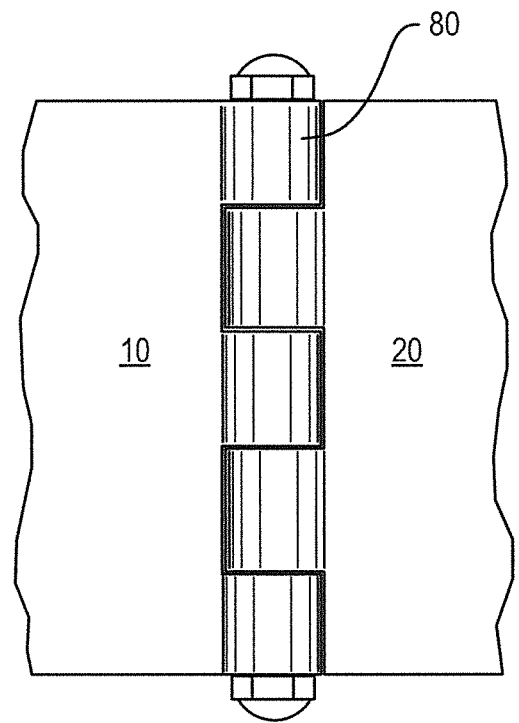
FIG. 2C shows an example of one way in which the filter member may be attached to the frame or a support.
Figure 2D:
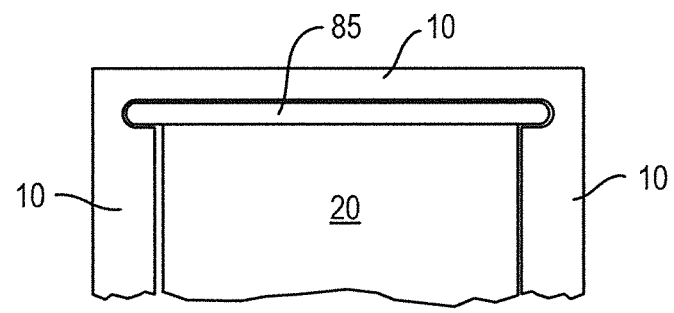
FIG. 2D shows an example of another way in which the filter member may be attached to the frame or a support.

The filter member 20 is movable relative to the apparatus such that it can move to a second position (hereinafter referred to as an 'open' position) in which an edge of the filter member is spaced apart from the frame. An example of this open position is shown in FIGS. 2A and 2B. As shown by the arrows in FIGS. 2A and 2B, when the filter member 10 is in an open position, air can flow into the apparatus through a gap 25 between the filter member 20 and the frame 10.

FIG. 2A also shows an example of an indicator 70 for indicating that the filter member should be cleaned or replaced. The indicator 70 is positioned such that it is obscured and not visible to a user when the filter member 20 is in the closed position (FIG. 1 A), but is visible to the user when the filter member is in the open position (FIG. 2A). The indicator may for example be a marking in a bright or fluorescent color, or may be a graphic or text sign indicating that the filter member should be cleaned or replaced.

The filter member 20 is designed so that in normal operation it adopts the closed position, but moves to the open position when passage of air through the filter member is obstructed (e.g. due to accumulation of dust, dirt or other foreign matter in the filter member). Specifically the filter member 20 may be weighted so that it is biased by the force of gravity into the closed position, but the force of air pressure of air drawn in by the fan is sufficient to move the filter member from the closed position to the open position when flow of air through the filter member is obstructed. The term 'weighted' refers to the total weight of the filter member and/or distribution of weight within the filter member.

In the above example, gravity and inertia are sufficient to bias or maintain the filter member in the closed position in normal operation (i.e. when the filter member is clean and passage of air through the filter member is not obstructed). However, in other examples the biasing may be due to any of a spring force, a friction force, a magnetic force, gravity or a combination thereof. For example there may be a biasing device to bias the filter member towards the closed position, the biasing device may for example comprise a spring, a friction fit between the frame and the filter member, or a magnet. In this case, the biasing force and the weight of the filter member is set at a level such that the bias to the closed position may be overcome by air pressure generated by the fan when passage of air through the filter member is obstructed.

In FIGS. 1A to 2B the filter member is pivotable relative to the apparatus and may pivot between a closed position (best seen in FIG. 1B) and an open position (best seen in FIG. 2B). The filter member may be pivotably connected to the frame 10, or may be pivotably connected to another part of the apparatus or to a support structure inside the apparatus. The pivot may for example be a hinge, or a pin or shaft rotatable in a supporting member or groove etc; by way of example only, FIG. 2C shows a hinge 80 attaching the filter member 10 to the frame or another support 10, and FIG. 2D shows a filter member 20 having a shaft 85 which is rotatably attached to the frame or another support 10.

In accordance with one example, in the closed position the filter member is approximately parallel to a wall of the apparatus (and/or the frame 10), while in the open position the filter member 20 is at an angle to the wall of the apparatus (and/or the frame 10). In the example of FIGS. 1A to 2B the filter member pivots about its upper edge 20A. The lower edge 20B of the filter member thus inclines towards the fan and interior of the apparatus when in the open position (see FIG. 2B). Having the filter member pivot around its upper edge 20A is convenient as it is easy to ensure that the filter member defaults to the closed position under force of gravity.

Figure 3A:
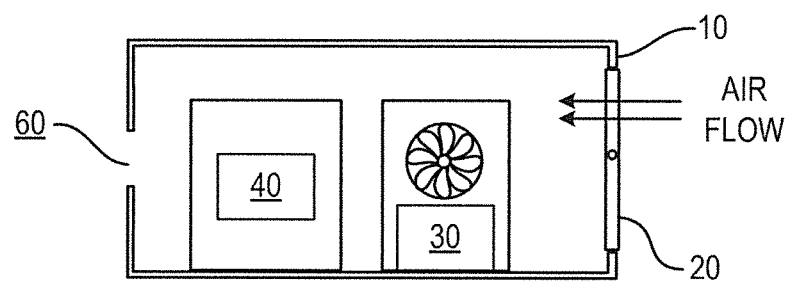
FIG. 3A is a schematic diagram showing another example of an apparatus including a filter member according to the present disclosure.
Figure 3B:
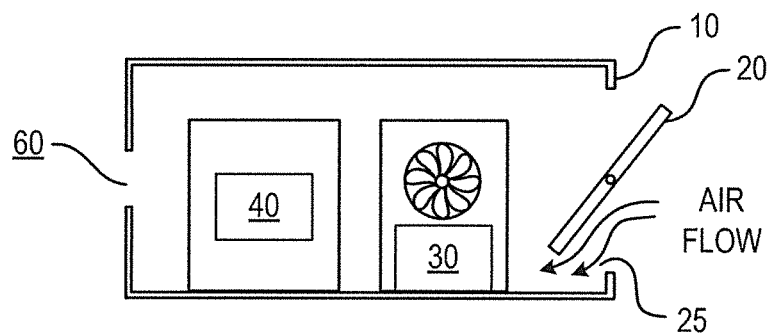
FIG. 3B is a schematic diagram showing the apparatus of FIG. 3A in which the filter member is in a different position compared to FIG. 3A.

In other examples, it possible for the filter member to pivot around a different part, e.g. a side edge or the bottom edge. FIGS. 3A and 3B are schematic diagrams showing an arrangement in which the filter member pivots around a middle point.

Figure 4A:
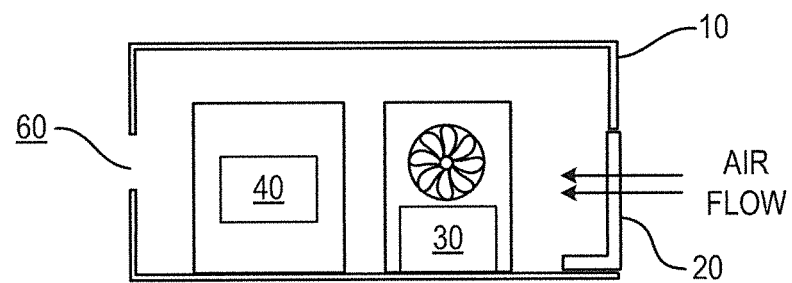
FIG. 4A is a schematic diagram showing another example of an apparatus including a filter member according to the present disclosure.
Figure 4B:
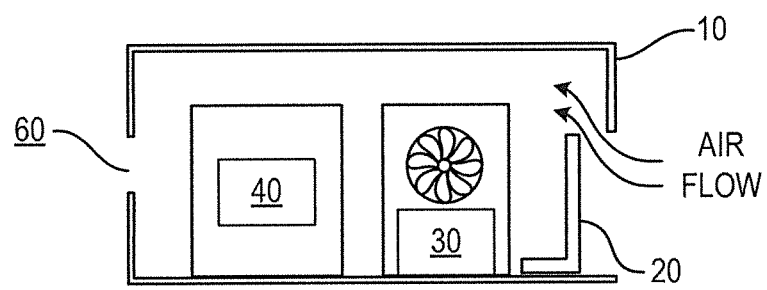
FIG. 4B is a schematic diagram showing the apparatus of FIG. 4A in which the filter member is in a different position compared to FIG. 4A.
Figure 4C:
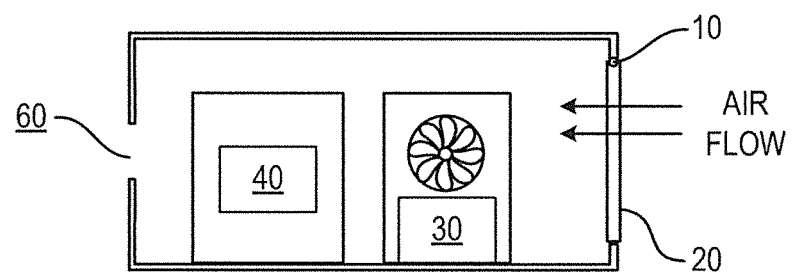
FIG. 4C is a schematic diagram showing another example of an apparatus including a filter member according to the present disclosure.
Figure 4D:
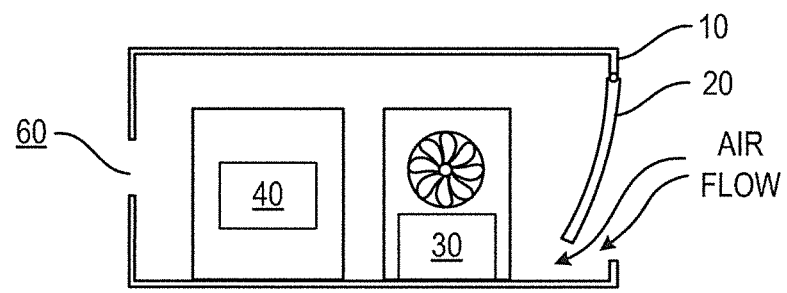
FIG. 4D is a schematic diagram showing the apparatus of FIG. 4C in which the filter member is in a different position compared to FIG. 4C.

FIGS. 4A and 4B meanwhile are schematic drawings showing an example in which the filter member 20 moves between a closed position (FIG. 4A) and an open position (FIG. 4B) by sliding rather than pivoting. FIGS. 4C and 4D are schematic drawings showing an example in which the filter member comprises, or is mounted on, a resilient material such as rubber and is designed to bend between the closed and open positions when, due to obstruction of passage of air through the filter member, air pressure is sufficient to overcome the resilient returning force of the material.

Figure 5:
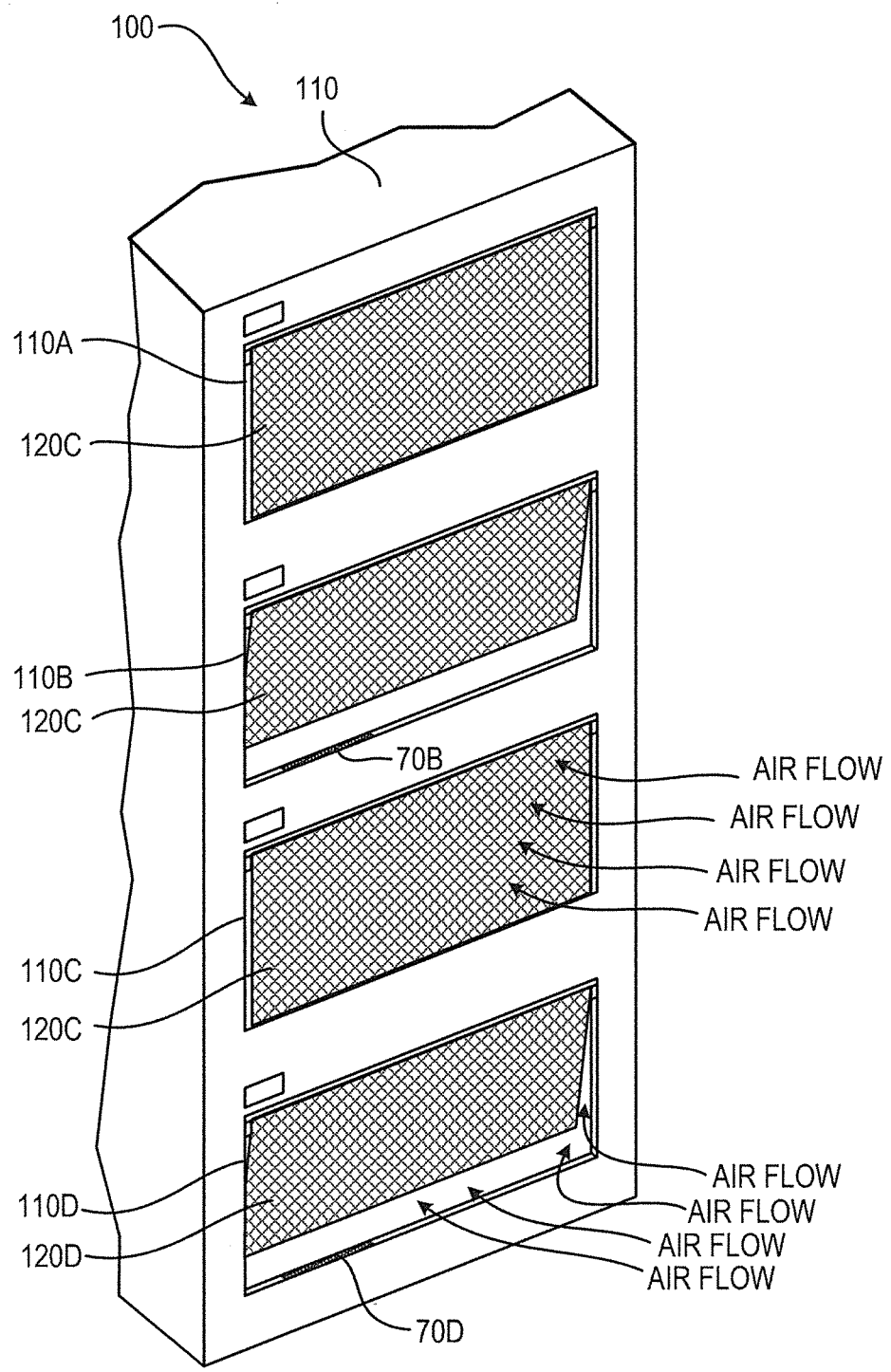
FIG. 5 is a perspective view showing an example of a bezel according to the present disclosure.

FIG. 5 shows a bezel 100 for use in an apparatus for housing computer equipment. A 'bezel' is a part or whole of a face of the apparatus for housing computer equipment (e.g. it may be the front face or a face having the filter member through which air is drawn into the housing). The bezel comprises a frame 110 having a plurality of apertures 110A, 110B, 110C and 110D. Each aperture has an associated filter member 120A, 120B, 120C and 120D. The filter members are pivotably connected to the frame and able to pivot (independently of each other) between a closed position and an open position. The filter members are weighted such that they default to the closed position, but are movable by air pressure to the open position when passage of air through the filter member is obstructed. In the closed position air passes through the frame and filter member, while in the open position air is able to pass through a gap between the frame and the filter member. Each filter member may have an associated indicator which is hidden from view when the filter member is in the closed position and visible when the filter member is in the open position. In FIG. 5 the first and third filter members 120A and 120C are in the closed positions, while the second and fourth filter members 120B and 120D are in open positions. The indicators 70B and 70D associated with the second and fourth filter members are visible and shown in FIG. 5.

Figure 6:
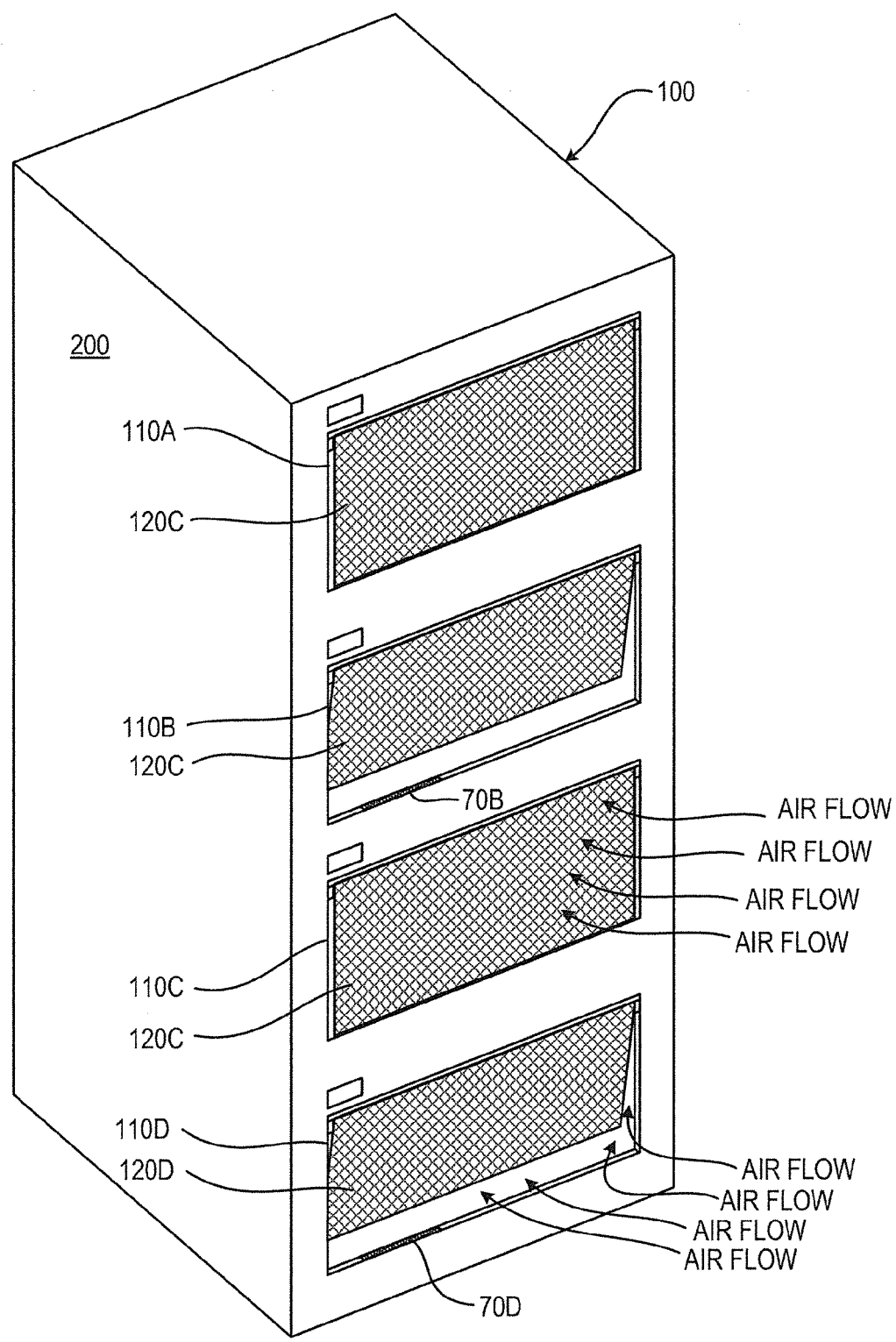
FIG. 6 is a perspective view showing an example of an apparatus including the bezel of FIG. 5.
Figure 7:
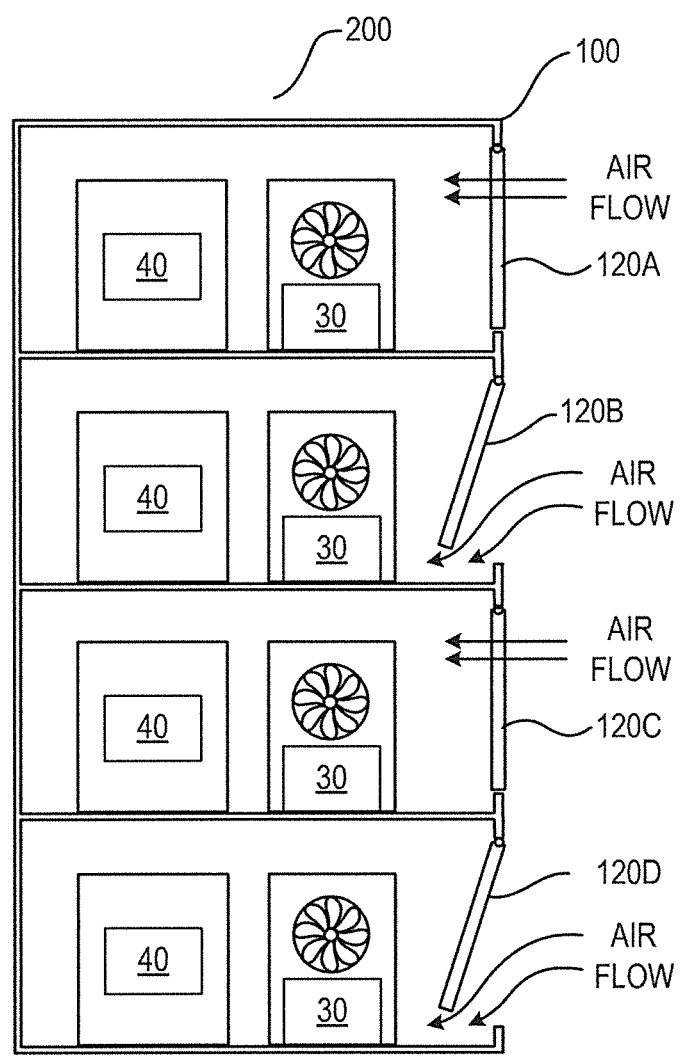
FIG. 7 is a schematic diagram showing an example of the apparatus of FIG. 6.

FIG. 6 is a perspective view of the bezel 100 of FIG. 5 applied to an apparatus 200 for housing computing equipment. FIG. 7 is a schematic view showing an example of possible contents and structure of the housing. In the example of FIGS. 6 and 7 it can be seen that the bezel 100 is applied to a front face of the housing. The bezel may for example be installed on a door which itself is openable to provide access to the computing equipment, or may be installed on a stationary wall of the housing. In some implementations the bezel may form only a part of a wall or face of the housing.

Examples of the air flow are shown by arrows in FIGS. 5 and 6, but for clarity and to avoid cluttering, air flow is only shown for the third and fourth filter members 120C and 120D.

In the example of FIG. 7 the apparatus has a rack structure with a number of levels or racks one on top of the other. Each level supports one or more servers 40 or other computing devices. In the illustrated example each level has a fan 30 for ventilation, although in other examples only some of the levels may have a fan or the fans may be placed elsewhere. Air channels may be provided so that air is drawn in through the filter members and directed to appropriate parts of the housing. Each level of the apparatus corresponds to a respective aperture and filter member 120A-120D of the frame 110 of the bezel. The flow of air into the housing is shown by the arrows in FIG. 7.

In FIGS. 5-7 the frame has a plurality of apertures which are vertically arranged one on top of the other. However, it would be possible to have a frame with a plurality of apertures positioned side by side, or to have several rows of apertures. Further it is possible for a frame to have a single aperture with a plurality of independently movable filter members associated with said single aperture.

Figure 8A:
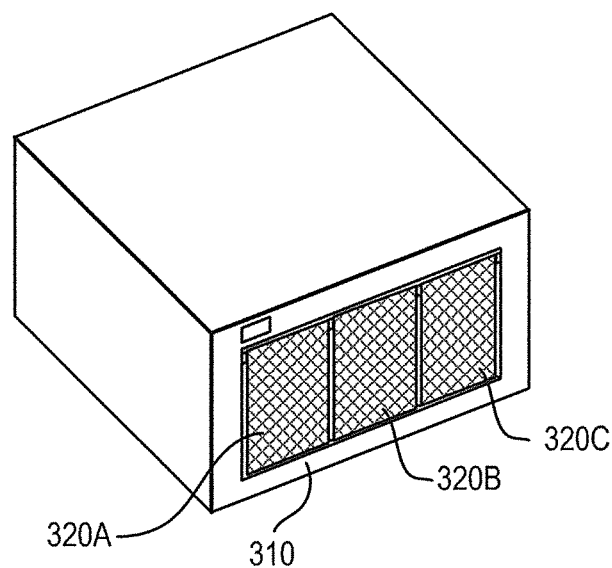
FIG. 8A is a perspective view of another example of a bezel including a filter member according to the present disclosure.
Figure 8B:
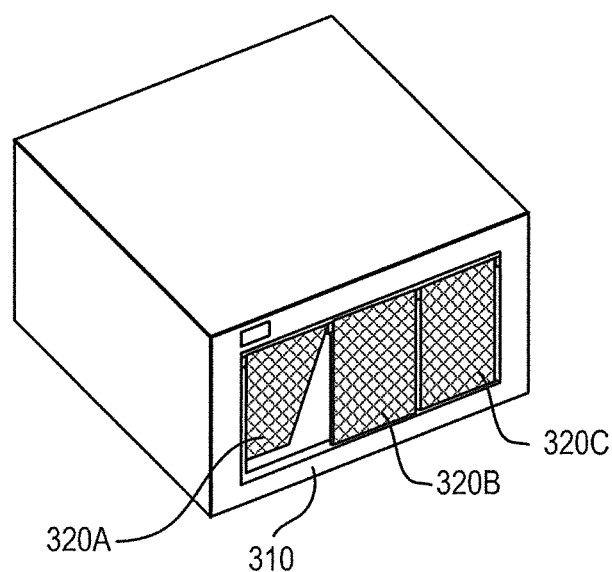
FIG. 8B is a perspective view showing an example of the bezel of FIG. 8A in which the filter member is in a different position compared to FIG. 8A

FIG. 8A shows an example which is similar to FIG. 1A, but in which a plurality of filter members 320A, 320B, 320C are associated with a single aperture of the frame 310. Each filter member is independently movable from a closed position to an open position by air pressure when passage of air through the filter member is obstructed. In comparison to the arrangement shown in FIG. 1A, in FIG. 8A a single filter member has been replaced by a plurality of smaller filter members. In some cases having smaller filter members in this way make it easier to achieve the desired weighting, such that a filter member can be moved from a closed position to an open position by air pressure when passage of air through the filter member is obstructed. In FIG. 8A all of the filter members are shown in the closed position. In FIG. 8B the first filter member 320A is shown in an open position, while the other filter members are shown in a closed position (e.g. air flow through the first filter member is obstructed so it is pushed open by the air flow, but air flow through the other filter members is not obstructed so they remain closed).

While FIG. 8A shows a single aperture with a plurality of filter members, it would also be possible to divide the single aperture into a plurality of apertures by dividers. In another example, the filter members could have different sizes as long as the weighting, any biasing device (if present) and air resistance were configured to allow the filter member to move from a closed position to an open position when the filter member was dirty and passage of air through the filter member obstructed.

Figure 9A:
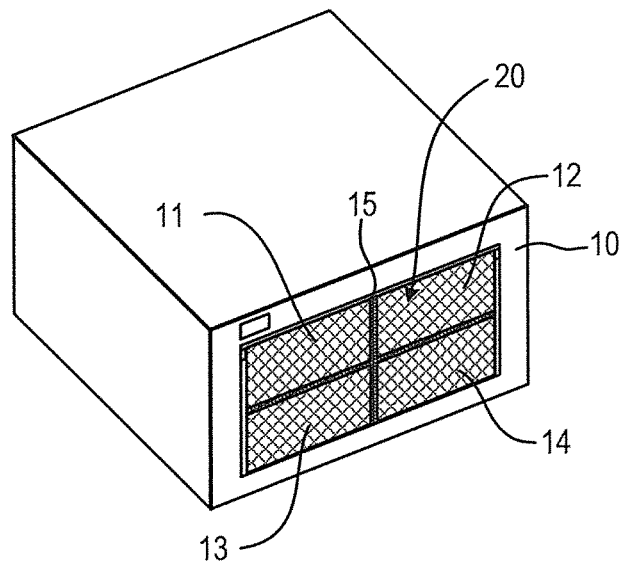
FIG. 9A is a perspective view of another example of an apparatus including a filter member according to the present disclosure.
Figure 9B:
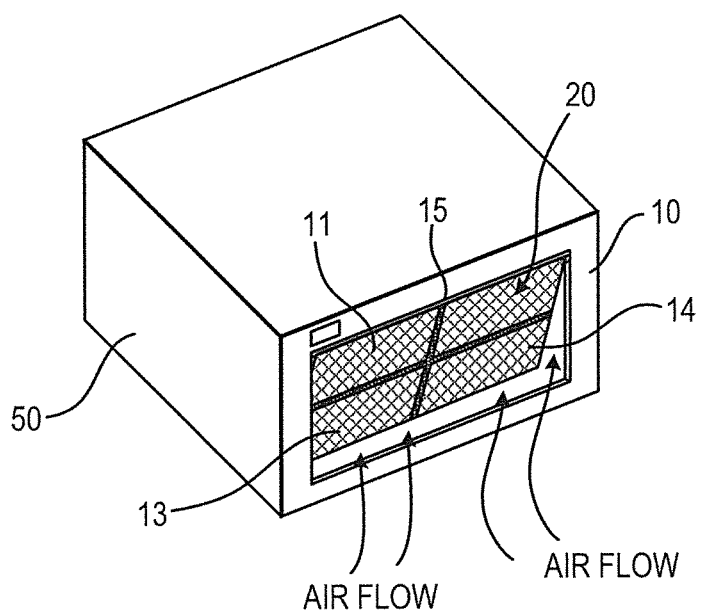
FIG. 9B is a perspective view showing an example of the apparatus of FIG. 9A in which the filter member is in a different position compared to FIG. 9A.

While in FIGS. 1A-8B above, the filter member is shown as having a single filter element, in other examples the filter member could comprise a plurality of filter elements held together by a lattice or other supporting structure. FIG. 9A is similar to the example of FIG. 1A, but shows an example in which the filter member 20 comprises a plurality of filter elements 11, 12, 13 and 14 held together by a supporting structure 15. The lattice or supporting structure may be formed of a material such as metal or plastic. In FIG. 9A the filter member 10 is in a closed position and in FIG. 9B it is in an open position.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A housing for computer equipment comprising:
a fan and a filter member, the filter member being movable between a closed position and an open position;
in the closed position air drawn into the housing by the fan passes through the filter member;
in the open position the filter member is spaced apart from the housing and air drawn into the housing by the fan flows through a gap between the housing and the filter member;
the filter member being biased into the closed position and movable into the open position by air pressure generated by the fan when passage of air through the filter member is obstructed.

2. The housing of claim 1 wherein the filter member is biased into the closed position by the weight of the filter member under gravity.

3. The housing of claim 1 wherein the filter member is biased into the closed position by a biasing device.

4. The housing of claim 1 wherein the filter member has an air resistance such that when the filter member is clean it adopts the closed position and passage of air through the filter member does not move the filter member to the open position, but when the filter member is dirty the filter member's air resistance is increased such that air pressure generated by the fan moves the filter member from the closed position to the open position.

5. The housing of claim 1 wherein the filter member is pivotably connected to the housing or a support within the housing and pivotable from the closed position to the open position.

6. The housing of claim 1 wherein the filter member is substantially parallel with a wall of the housing in the closed position and at angle to the wall of the housing in the open position.

7. The housing of claim 1 wherein a portion of the filter member moves towards the fan when the filter member moves from the closed position to the open position.

8. An apparatus comprising:
a fan to draw air into the apparatus and;
a filter member pivotably connected to the apparatus and able to pivot between a first position in which the filter member is positioned against a frame and air can pass through the filter member into the apparatus and a second position in which the filter member is spaced apart from the frame and air can enter the apparatus by passing through a gap between an edge of the filter member and the frame;
the filter member being weighted to move from the first position to the second position when passage of air through the filter member is obstructed.

9. The apparatus of claim 8 wherein the frame has a plurality of apertures each of which is associated with a respective filter member; each filter member being movable between a first position in which it is positioned against the frame and a second position in which an edge of the filter member is spaced apart from the frame.

10. The apparatus of claim 9 further comprising a rack having a plurality of rows and wherein each aperture in the frame corresponds to a row on the rack.

11. The apparatus of claim 8 wherein the filter member has a top edge and a bottom edge and the wherein the filter member is pivotable about its top edge.

12. The apparatus of claim 8 wherein the filter member has a top edge and a bottom edge and wherein the bottom edge of the filter member moves towards the interior of the housing in the second position.

13. The apparatus of claim 8 wherein the housing includes an indicator which is visible when the filter member is in the first position and obscured when the filter member is in the second position.

14. The apparatus of claim 13 wherein the indicator is a bright or fluorescent marking, or a sign indicating that the filter should be cleaned or replaced.

15. The apparatus of claim 8 wherein the apparatus houses servers, data storage devices, and/or network devices.

16. A bezel for computing equipment comprising:
a frame and a filter member pivotably attached to the frame to pivot between a closed position in which the filter member is positioned against the frame and air can pass through the filter member and an open position in which an edge of the filter member is spaced apart from the frame and air can flow through a space between the filter member and the frame;
the filter member being movable under air pressure from the closed position to the open position when flow of air through the filter member is obstructed.

17. The bezel of claim 16 wherein the frame defines an aperture, a plurality of filter members are pivotably attached to the frame, and
wherein each filter member is located within the same aperture of the frame, and
wherein each filter member is independently movable from a closed position to an open position under air pressure when passage of air through said filter member is obstructed.

18. The bezel of claim 16 wherein the frame defines a plurality of apertures, and wherein each aperture is associated with a respective filter member, each filter member being movable from a closed position to an open position, each filter member substantially covering the aperture which it is associated with when the filter member is in the closed position and spaced apart from the aperture to allow flow of air through a gap between the filter member and the aperture when the filter member is in an open position.

19. The housing of claim 1, wherein the filter member is resiliently bendable from the closed position to the open position.

20. The bezel of claim 16, wherein the filter member slides from the closed position to the open position.

\* \* \* \* \*

UNITED STATES PATENT AND TRADEMARK OFFICE
CERTIFICATE OF CORRECTION

PATENT NO. : 9,149,753 B2
APPLICATION NO. : 13/850801
DATED : October 6, 2015
INVENTOR(S) : Hsiu Hsien Wang It is certified that error appears in the above-identified patent and that said Letters Patent is hereby corrected as shown below:

In column 6, line 3, in Claim 6, delete "at angle" and insert -- at an angle --, therefor.

In column 6, line 31, in Claim 11, delete "and the" and insert -- and --, therefor.

Signed and Sealed this
Twenty-sixth Day of July, 2016

Michelle K. Lee
*Director of the United States Patent and Trademark Office*